(12) United States Patent
Hong et al.

(10) Patent No.: US 8,755,665 B2
(45) Date of Patent: Jun. 17, 2014

(54) ELECTROMAGNETIC WAVE GATHERING DEVICE AND SOLAR CELL MODULE HAVING THE SAME

(75) Inventors: Kai-Yi Hong, Hsinchu (TW); Wu-Tsung Lo, Hsinchu (TW); Shih-Chang Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 315 days.

(21) Appl. No.: 13/171,833

(22) Filed: Jun. 29, 2011

(65) Prior Publication Data

US 2012/0002291 A1  Jan. 5, 2012

(30) Foreign Application Priority Data

Jun. 30, 2010  (TW) .............................. 99121596 A

(51) Int. Cl.
*G02B 6/00* (2006.01)
(52) U.S. Cl.
USPC ....................................................... 385/146
(58) Field of Classification Search
None
See application file for complete search history.

(56) References Cited

U.S. PATENT DOCUMENTS

| | | | |
|---|---|---|---|
| 5,109,465 A * | 4/1992 | Klopotek ...................... | 385/133 |
| 5,936,777 A | 8/1999 | Dempewolf | |
| 7,164,839 B2 * | 1/2007 | Nyhart et al. ................. | 385/131 |
| 7,391,939 B1 * | 6/2008 | Williams ........................ | 385/31 |
| 7,565,050 B2 * | 7/2009 | Lee et al. ...................... | 385/133 |
| 7,777,955 B2 * | 8/2010 | Cassarly et al. .............. | 359/618 |
| 7,925,129 B2 * | 4/2011 | Ghosh et al. .................... | 385/31 |
| 8,385,708 B2 * | 2/2013 | Nyhart, Jr. .................... | 385/133 |
| 2006/0174867 A1 | 8/2006 | Schaafsma | |
| 2009/0126777 A1 | 5/2009 | Khazeni et al. | |
| 2009/0126792 A1 | 5/2009 | Gruhlke et al. | |
| 2010/0180946 A1 | 7/2010 | Gruhlke et al. | |
| 2010/0206369 A1 | 8/2010 | Kim et al. | |
| 2011/0096426 A1 * | 4/2011 | Ghosh et al. .................. | 359/853 |
| 2012/0055552 A1 * | 3/2012 | Morgan et al. ................ | 136/259 |

FOREIGN PATENT DOCUMENTS

TW  200937655 A  9/2009
WO  WO-2010033859 A2  3/2010

* cited by examiner

*Primary Examiner* — Sung Pak
(74) *Attorney, Agent, or Firm* — Patterson & Sheridan, LLP

(57) ABSTRACT

An electromagnetic wave gathering device includes a pillared electromagnetic waveguide body and a reflective structure. The reflective structure is located at about an axis of the pillared electromagnetic waveguide body. The reflective structure comprises a plurality of bicone reflective units. Each of the reflective units has a first reflective surface. The electromagnetic wave gathering device may have a smaller volume and is handy for use.

19 Claims, 14 Drawing Sheets

ELECTROMAGNETIC WAVE GATHERING DEVICE AND SOLAR CELL MODULE HAVING THE SAME

REFERENCE TO RELATED APPLICATION

This application claims the right of priority based on Taiwan application Serial No. 099121596, filed on Jun. 30, 2010, and the content of which is hereby incorporated by reference.

BACKGROUND

1. Technical Field

The present application relates to an electromagnetic wave gathering device, and to a solar cell module having the same device.

2. Description of the Related Art

The power-generating principle of a solar cell is that the solar cell absorbs the sunlight of specific wavelength and directly converts the optical energy to the electric energy.

Recently, the solar cell develops rapidly, and the high concentration photovoltaic solar cell (HCPV) is particularly spotlighted. The high concentration photovoltaic solar cell includes a solar cell chip and a condensing module. The solar cell chip converts the optical energy to the electric energy, and the condensing module condenses the sunlight and casts the sunlight onto the solar cell chip.

In the conventional technology, the condensing module can be categorized into refractive and reflective condensing modules. The refractive condensing module uses condensing lenses or Fresnel Lens to focus the sunlight first. The sunlight after first focus is further condensed and uniformed by the second optical lens and thereby enters the solar cell chip. The reflective condensing module focuses the sunlight by parabolic or spherical reflective lenses first. The sunlight after focalization progresses into the second optical lenses to perform further spotlight minimization and uniformity optimization, and thereby enters the solar cell chip.

Nevertheless, refractive and reflective condensing modules both need the vertical incident light. Therefore, the condensing modules need a sun-tracking system which causes the inconvenient use of the condensing module. During the condensing process, the condensing modules need to keep suitable volume in order to control the focus and the focal length conveniently, so the volume of the condensing modules is difficult to be reduced.

Therefore, how to reduce the volume of the condensing modules and promote the convenience for use and thereby expanding the application of the condensing modules and the solar cell is the main issue for the people skilled in the related field.

SUMMARY OF THE APPLICATION

The present application provides an electromagnetic wave gathering device which can reduce the volume and is handy for use.

The present application also provides a solar cell which is handy for use.

The present application provides an electromagnetic wave gathering device comprising a pillared electromagnetic waveguide body and a reflective structure. The reflective structure is positioned at about the axis of the pillared electromagnetic waveguide body. The reflective structure comprises a plurality of bicone reflective units, and each of the plurality of bicone reflective units comprises a first reflective layer.

The application also proposes an electromagnetic wave gathering device comprising a flat-plate electromagnetic waveguide body. The flat-plate electromagnetic waveguide body has a first surface, second surface, and a zigzag reflective structure positioned on the second surface. The zigzag reflective structure comprises a plurality of reflective units. Each of the plurality of reflective units has a first inclined surface and a second inclined surface. The abutment of the first inclined surface and the second inclined surface forms an arc shape, wherein a reflective layer is formed at least on the first inclined surface.

The application provides a solar cell module comprising the electromagnetic wave gathering device described above and at least one energy transfer device positioned at about the at least one side surface of the electromagnetic wave gathering device.

The electromagnetic wave gathering device and the solar cell of the application comprise the pillared electromagnetic waveguide body and the reflective structure. Therefore, the light from different directions progresses into the pillared electromagnetic waveguide body vertically without the aid of the sun-tracking system, and the convenient use of the electromagnetic wave gathering device and the solar cell is raised. With the cooperation of the pillared electromagnetic waveguide body, the reflective structure reflects the light towards the predetermined direction and condenses the light easily. Without the influence of the focus and the focal length, the reflective structure helps to reduce the volume of the electromagnetic wave gathering device.

So that the manner in which the above recited features of the present application can be understood in detail, a more particular description of the application briefly summarized above, may be had by reference to embodiments, some of which are illustrated in the appended drawings.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

Figure 1:
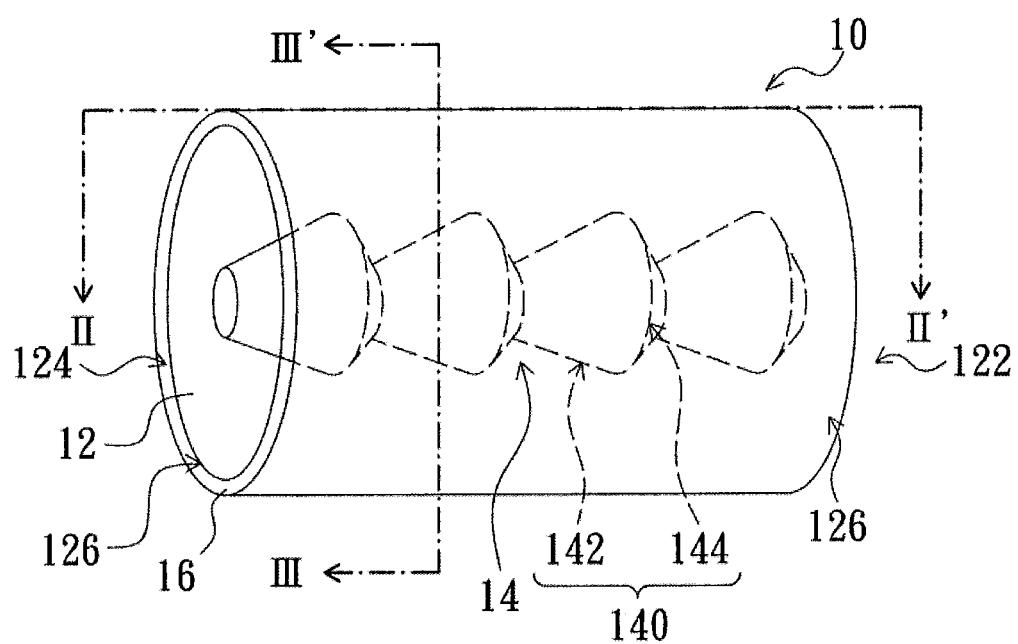
FIG. 1 is a perspective diagram of an electromagnetic wave gathering device of an embodiment of the present application.

Numerals of drawings are explained as follows;
100: a solar cell
10, 30, 40, 60: an electromagnetic wave gathering device
12, 42, 62: an electromagnetic waveguide body
122, 622: a first side surface
124, 624: a second side surface
126: a surface
14, 34, 44, 64: a reflective structure
140, 440, 640: a reflective unit
142, 442, 642: a first reflective layer
144, 444, 644: a second reflective layer
422: a first surface
424: a second surface
16, 46: an anti-reflective layer
17, 67: a reflective layer
18, 18a: a light
70, 70': an energy transfer device

DESCRIPTION OF THE PREFERRED EMBODIMENTS

To better and concisely explain the application, the same name or the same reference number given or appeared in different paragraphs or figures along the specification should has the same or equivalent meanings while it is once defined anywhere of the application.

The following shows the description of the embodiments of the present application in accordance with the drawings.

Figure 2A:
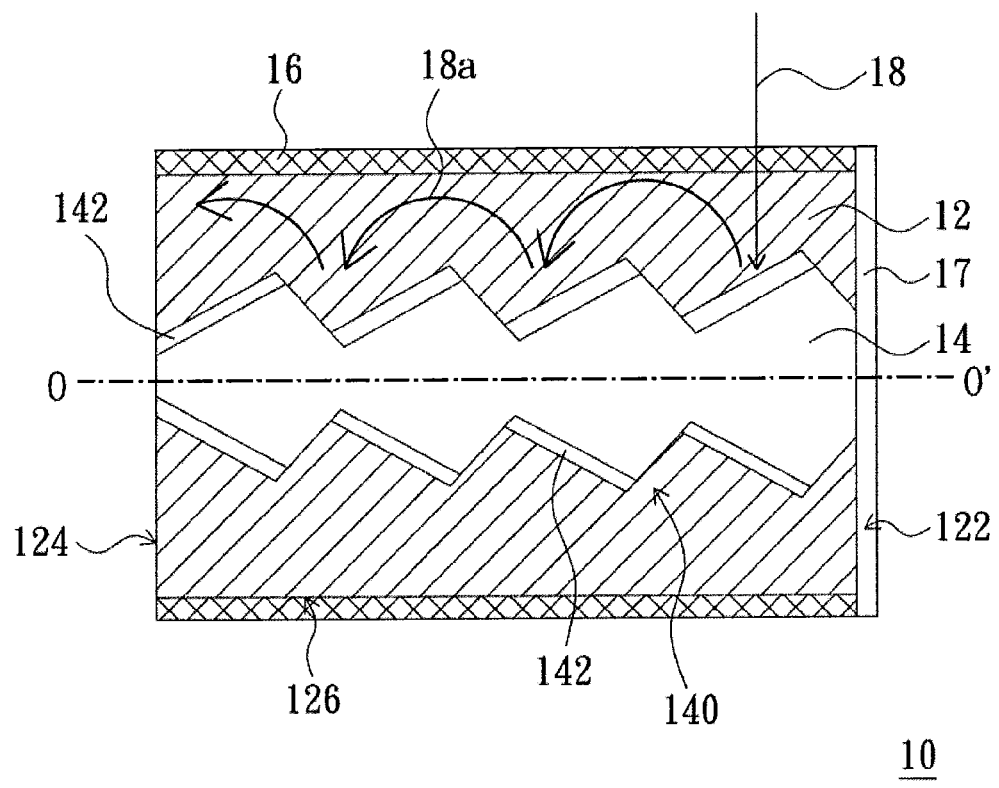
FIGS. 2A-2C illustrate cross-sectional diagrams taken along line the electromagnetic wave gathering device shown in FIG. 1.
Figure 2B:
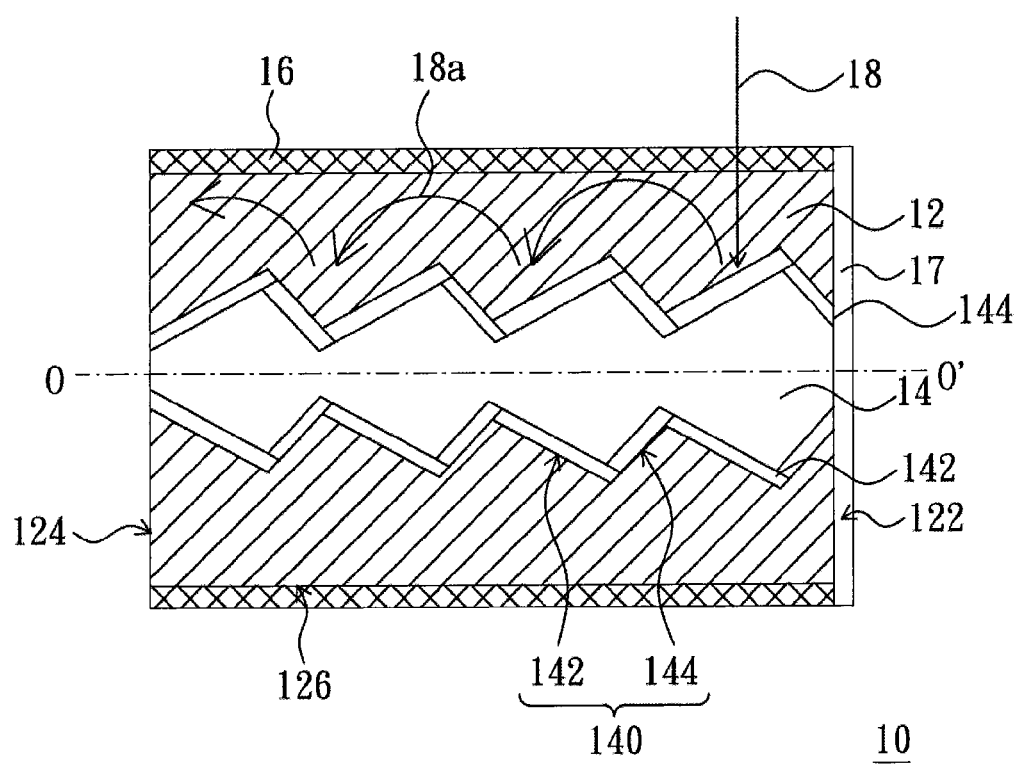
Figure 2C:
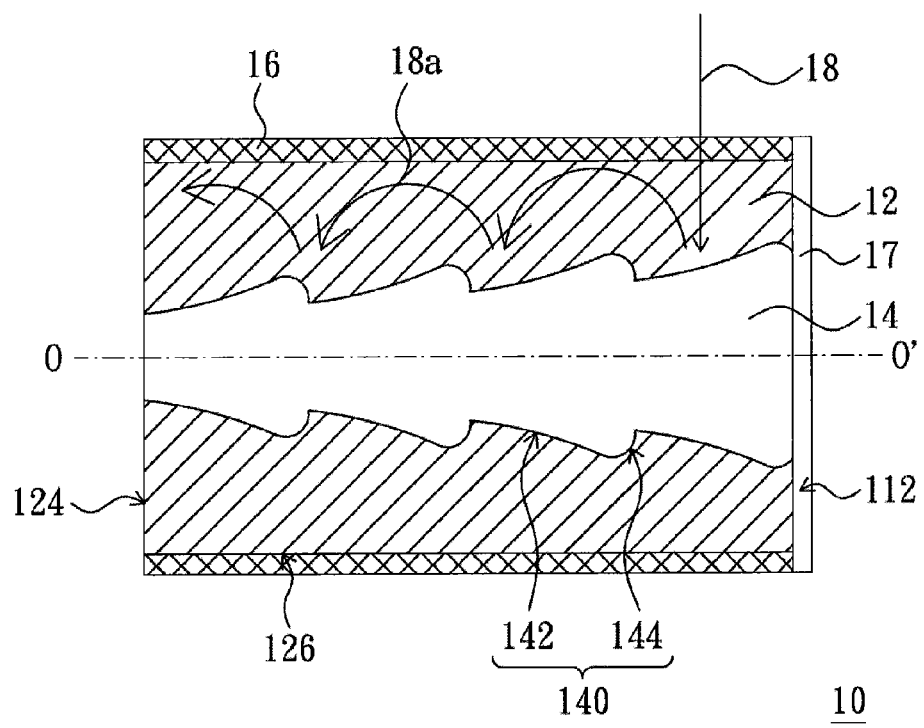

FIG. 1 is a perspective diagram of an electromagnetic wave gathering device according to an embodiment of the present application. FIGS. 2A-2C are cross-sectional diagrams taken along line II-II' of the electromagnetic wave gathering device shown in FIG. 1.

Referring to FIG. 1 and FIGS. 2A-2C, the electromagnetic wave gathering device 10 according to the embodiment of the application includes a pillared electromagnetic waveguide body 12 and a reflective structure 14. In the embodiment, the reflective structure 14 positioned at about an axis OO' of the pillared electromagnetic waveguide body 12 includes a plurality of bicone reflective units 140. Each of the plurality of bicone reflective units 140 includes a first reflective layer 142. In the embodiment, the reflective structure 14 of the electromagnetic wave gathering device 10 is a hollow structure. The electromagnetic wave gathering device 10 is used to gather electromagnetic waves having different wavelengths like light which is used as an example in the following embodiment.

As described above, the pillared electromagnetic waveguide body 12 comprises a first side surface 122, a second side surface 124 opposite to the first side surface 122, and a surface 126 connected to the first side surface 122 and the second side surface 124.

In particular, in order to raise the utilization of the light, the electromagnetic wave gathering device 10 further comprises an anti-reflective layer 16 positioned on the surface 126 of the pillared electromagnetic waveguide body 12. The anti-reflective layer 16 reduces the probability of the total reflection of an incident light 18, and increases the amount of the light entering the chamber of the electromagnetic wave gathering device 10.

In the pillared electromagnetic waveguide body 12, the refractivity near the reflective structure 14 is larger than the refractivity near the anti-reflective layer 16. For example, the refractivity of the electromagnetic waveguide body 12 increases along the direction from the anti-reflective layer 16 to the reflective structure 14 gradually or stepwise.

Referring to FIG. 2A, the light 18 entering the pillared electromagnetic waveguide body 12 is reflected by the first reflective layer 142, and the reflected light 18a progresses in the direction away from the axis OO' first. The reflected light 18a changes the direction gradually towards the axis OO' because the refractivity of the electromagnetic waveguide body 12 increases along the direction from the anti-reflective layer 16 to the reflective structure 14 gradually or stepwise. After the light 18a is reflected and refracted for several times, the light 18a is concentrated onto the second side surface 124 of the pillared electromagnetic waveguide body 12.

The reflective structure 14 reflects the incident light 18 towards the predetermined direction. In detail, the first reflective layer 142 of the bicone reflective unit 140 of the reflective structure 14 reflects the light incident thereon towards the second side surface 124 of the pillared electromagnetic waveguide body 12. Thus, the light is concentrated and exits from the second side surface 124.

FIG. 2B is another embodiment of the present application. In the embodiment, the bicone reflective unit 140 comprises a second reflective layer 144. The second reflective layer 144 is adjacent to the first reflective layer 142. In this embodiment, the area of the first reflective layer 142 is larger than the area of the second reflective layer 144.

Further, the second reflective layer 144 reflects the light incident thereon towards the first side surface 122 of the pillared electromagnetic waveguide body 12 and thereby condenses the light. In order to utilize the light entering the pillared electromagnetic waveguide body 12 efficiently and raise the intensity of the light emitted from the second side surface 124, a reflective layer 17 is positioned on the first side surface 122 for reflecting the light incident on the first side surface 122 towards the second side surface 124 and thereby increases the intensity of the light emission of the second side surface 124.

In the embodiment, the first reflective layer 142 or the second reflective layer 144 of the bicone reflective unit 140 is formed by coating a reflective layer on the surface of the bicone reflective unit 140. The material of the reflective layer can be high reflectivity metals like silver (Ag), aluminum (Al) or copper (Cu), or a distributed bragg reflector (DBR) which is stacked by oxides of different refractivities.

As shown in FIG. 2B, the first reflective layer 142 and the second reflective layer 144 can be the inclined surfaces, and the abutment of the first reflective layer 142 and the second reflective layer 144 can be an angle, or the arc surfaces as shown in FIG. 2C, wherein the abutment of the first reflective layer 142 and the second reflective layer 144 can be an arc shape. Furthermore, the first reflective layer 142 and the second reflective layer 144 are connected separately, adjacently or seamlessly to one another.

Figure 3:
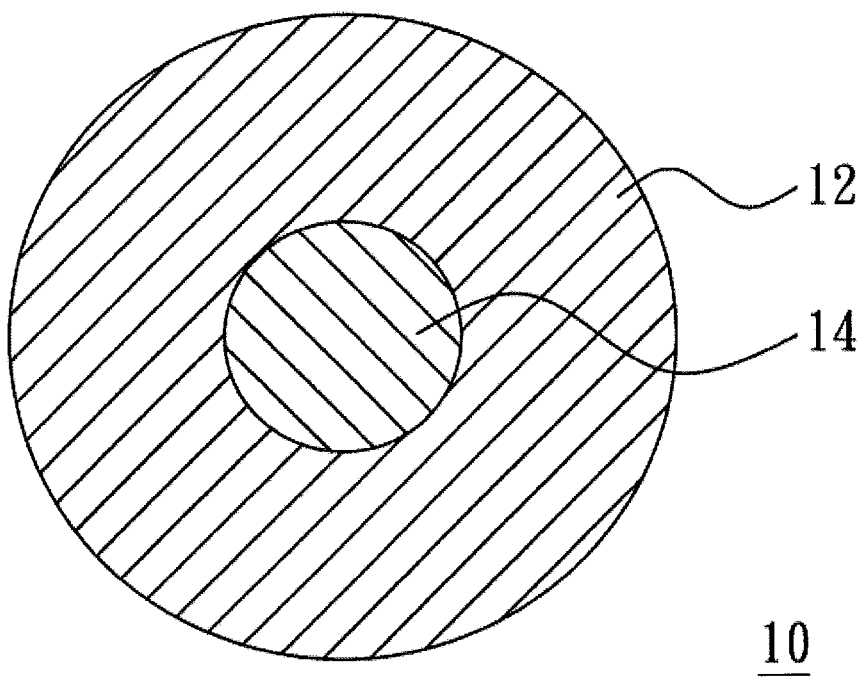
FIG. 3 is a cross-sectional diagram taken along line III-III' of the electromagnetic wave gathering device shown in FIG. 1.
Figure 4:
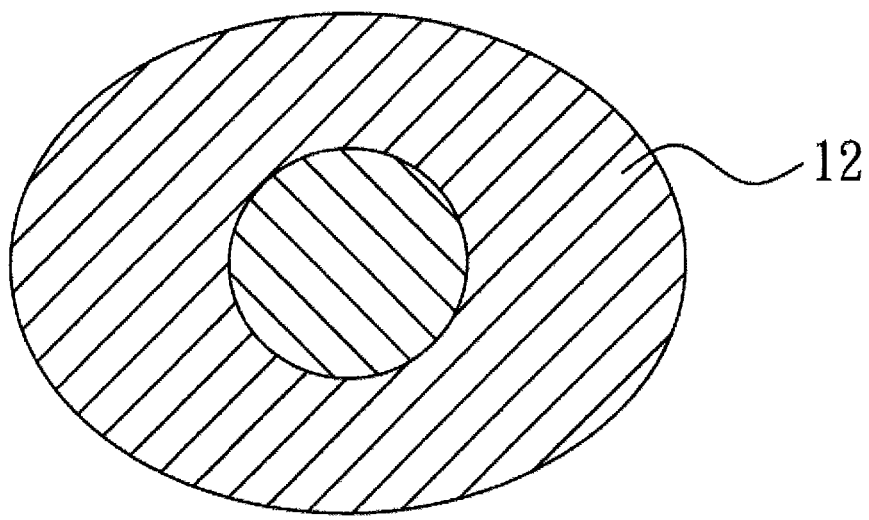
FIG. 4 is another cross-sectional diagram taken along line III-III' of the electromagnetic wave gathering device shown in FIG. 1.
Figure 5:
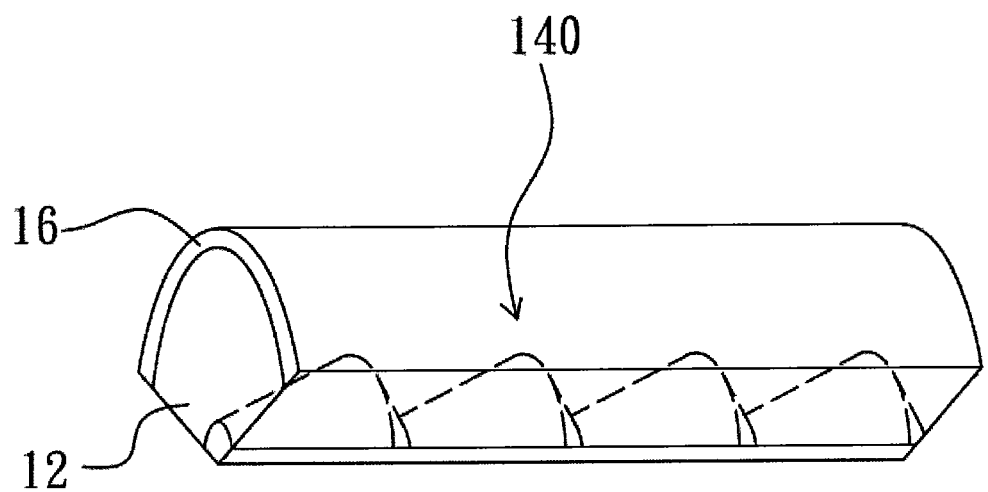
FIG. 5 is a cross-sectional diagram of the electromagnetic wave gathering device according to another embodiment of the present application.

Further, the reflective structure 14 may be positioned at about the axis, or arbitrarily inside the pillared electromagnetic waveguide body 12. Besides, the pillared electromagnetic waveguide body 12 can have different shapes of cross-section of the pillared electromagnetic waveguide body 12, such as a circle illustrated in FIG. 3, or an ellipse shown in FIG. 4. In addition, the cross-section of the pillared electromagnetic waveguide body 12 also comprises triangle, rectangle, polygonal, or sectorial. Furthermore, the reflective unit 140 can be the orbicular bicone structure according to the above-described embodiment, or be the partial bicone structure when the cross-section of the pillared electromagnetic waveguide body 12 is sectorial as shown in FIG. 5.

The above-described electromagnetic wave gathering device 10 comprises the pillared electromagnetic waveguide body 12 and the reflective structure 14. Therefore, the light from different directions progresses into the pillared electromagnetic waveguide body 12 vertically without the aid of the sun-tracking system, so the electromagnetic wave gathering device 10 is more convenient to use. With the cooperation of the pillared electromagnetic waveguide body 12, the reflective structure 14 reflects the light towards the predetermined direction easily and concentrates the light. Since the reflective structure 14 is not bound by the focus and the focal length, it benefits the electromagnetic wave gathering device 10 to minimize the volume.

Figure 6:
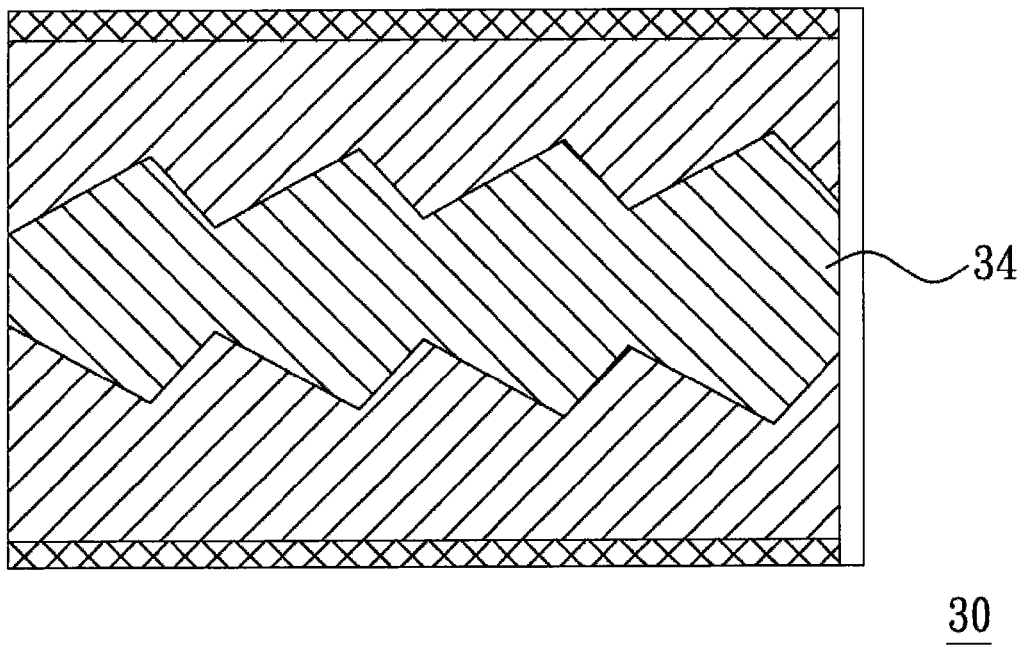
FIG. 6 is a cross-sectional diagram of the electromagnetic wave gathering device according to another embodiment of the present application.

FIG. 6 is a cross-sectional diagram of the electromagnetic wave gathering device according to another embodiment of the application. As shown in FIG. 6, an electromagnetic wave gathering device 30 is similar to the electromagnetic wave gathering device 10, and one difference between them is a reflective structure 34 of the electromagnetic wave gathering device 30 is a solid structure. The above-described reflective structure 34 is directly formed by the optical-reflective materials used in the bicone reflective unit 140 of the above-described embodiment.

Figure 7A:
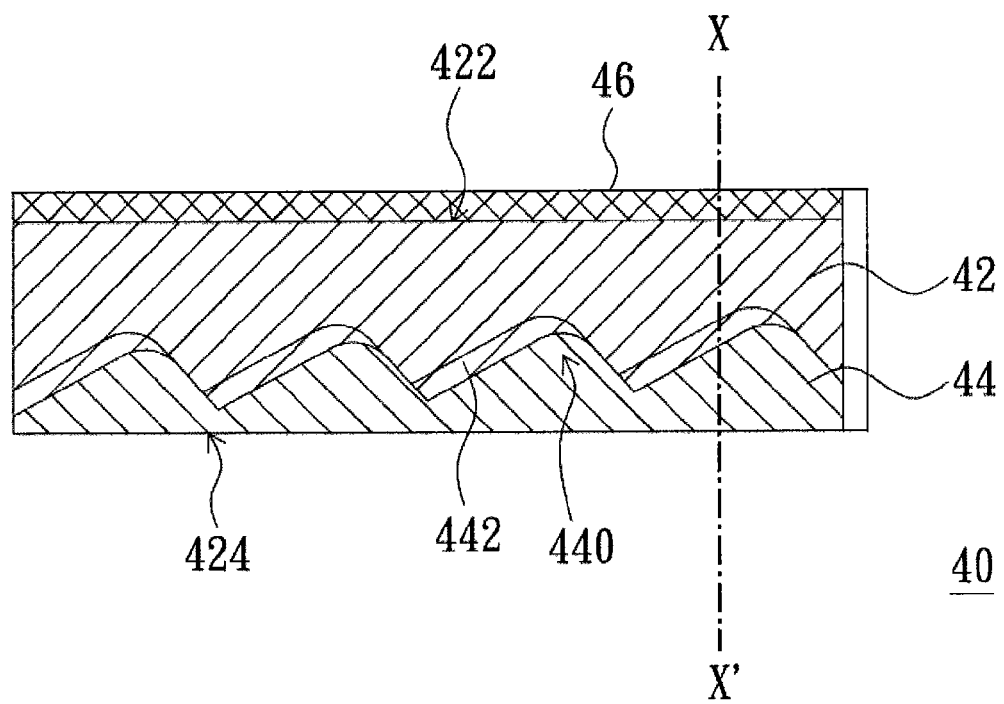
FIGS. 7A-7B illustrate cross-sectional diagrams of the electromagnetic wave gathering device according to another embodiment of the present application.
Figure 7B:
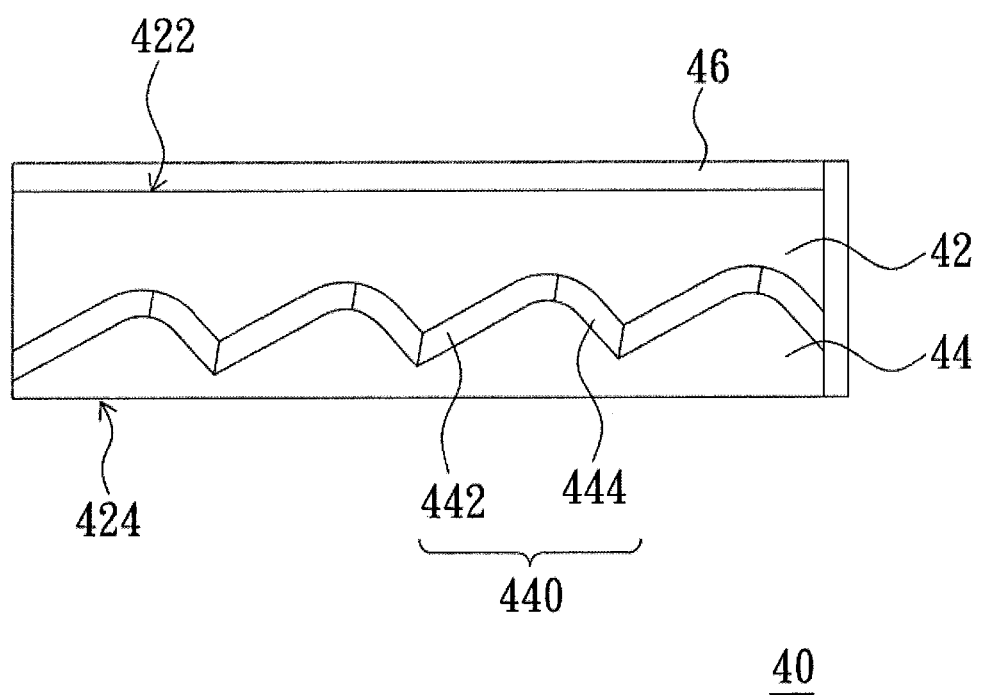

FIGS. 7A-7B illustrate another embodiment of the application. As shown in FIG. 7A, a flat-plate electromagnetic wave gathering device 40 includes an electromagnetic waveguide body 42 comprising a first surface 422 and a second surface 424, and a reflective structure 44. An anti-reflective layer 46 is positioned on the first surface 422 of the electromagnetic waveguide body 42, and the reflective structure 44 is positioned on the second surface 424 of the flat-plat electromagnetic waveguide body 42. The reflective structure 44 comprising a plurality of reflective units 440 forms a zigzag structure, and the reflective unit 440 at least comprises a first reflective layer 442.

Further, as shown in FIG. 7B, each reflective unit 440 comprises a second reflective layer 444, and the first reflective layer 442 is connected to the second reflective layer 444, wherein the abutment of the first reflective layer 442 and the second reflective layer 444 can be an angle or an arc shape.

Otherwise, the second reflective layer 444 is connected to the first reflective layer 442 adjacently or separately in the above-described embodiment.

In addition, the refractivity near the first surface 422 is smaller than the refractivity near the second surface 424 in the above-described electromagnetic waveguide body, and the refractivity increases along the direction from the first surface 422 to the second surface 424 gradually or stepwise.

In the embodiment of the application, the material of the first reflective layer 442 or the second reflective layer 444 of the reflective unit 440 can be high reflectivity metals like silver (Ag), aluminum (Al) or copper (Cu), or a distributed bragg reflector (DBR) which is stacked by oxides of different refractivities.

Figure 8A:
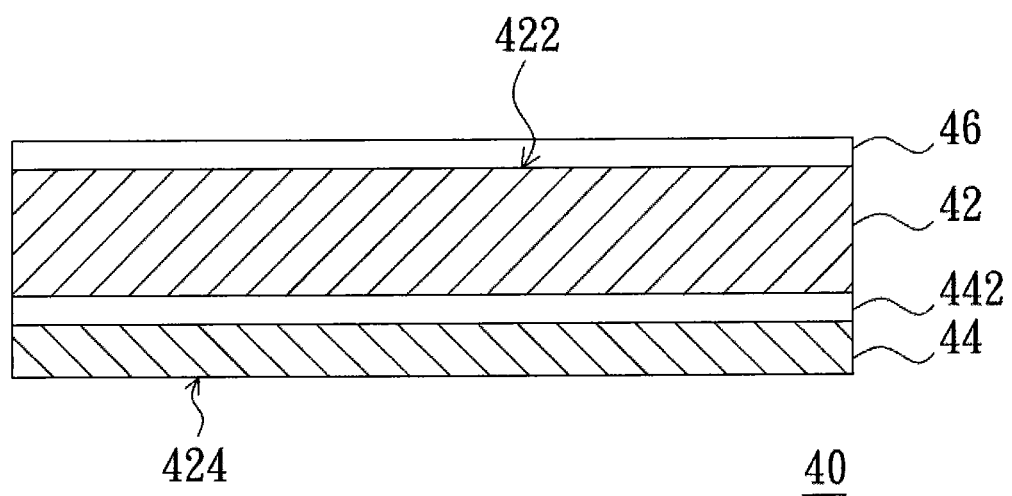
FIGS. 8A-8B illustrate cross-sectional diagrams taken along line X-X' of the electromagnetic wave gathering device shown in FIG. 7A.
Figure 8B:
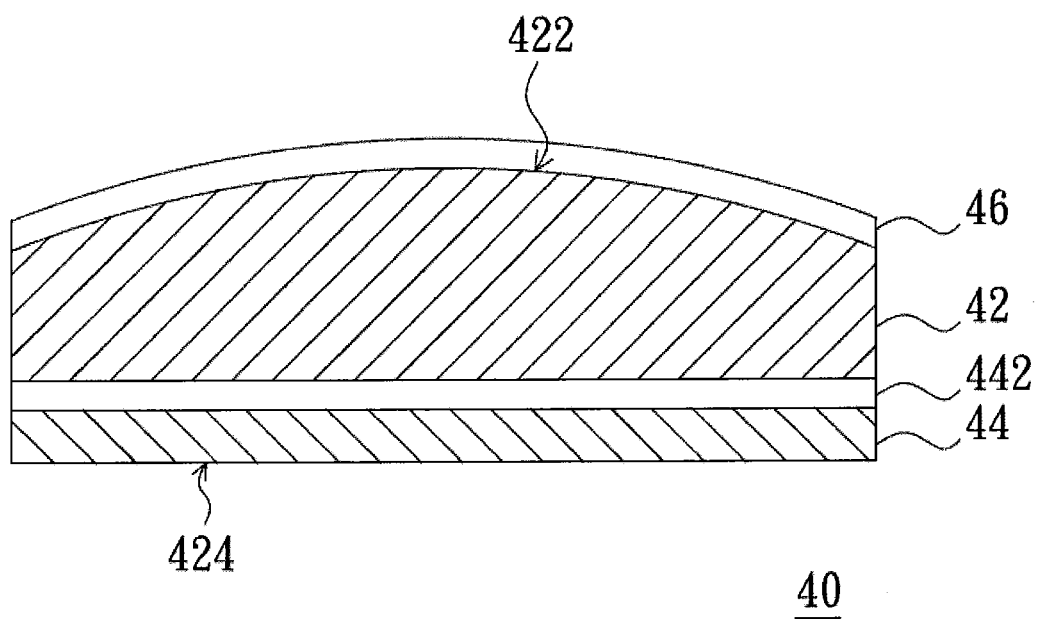

FIGS. 8A-8B illustrate cross-sectional diagrams taken along line X-X' of the electromagnetic wave gathering device 40 shown in FIG. 7A. As shown in FIG. 8A, the first surface 422 and the second surface 424 are parallel to one another, and the first reflective layer 442 is also parallel to the first surface 422 and the second surface 424. Thus, the electromagnetic waveguide body 42 forms a flat-plate electromagnetic waveguide body. Besides, the first surface 422 can also be an arc surface and the second surface 424 is a flat surface as shown in FIG. 8B, so the light receiving surface of the electromagnetic waveguide body 42 is the arc surface.

Figure 9A:
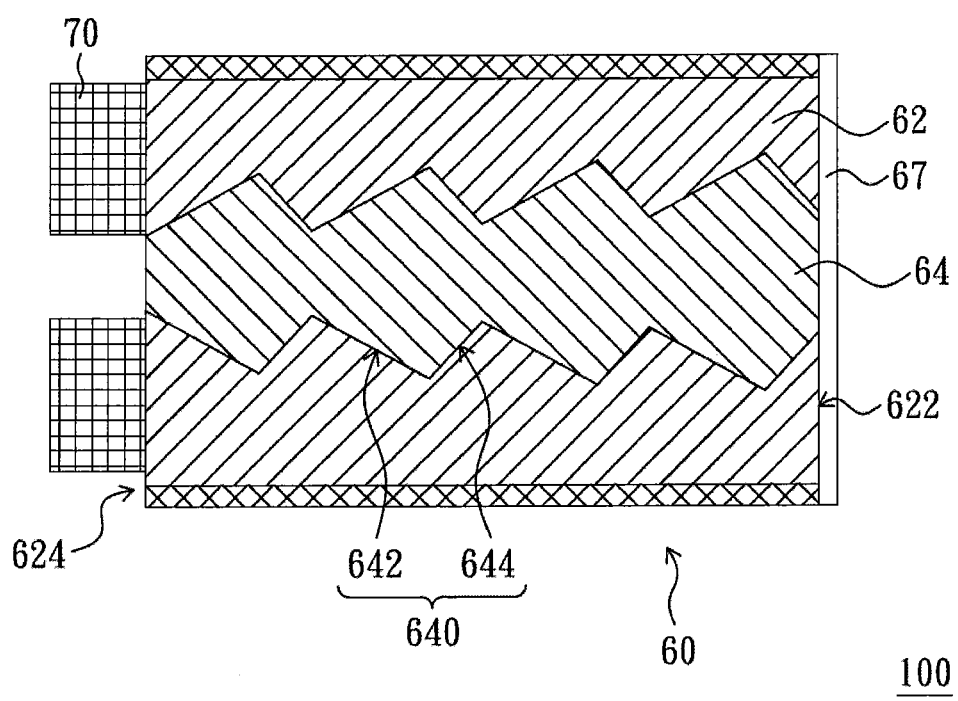
FIGS. 9A-9B illustrate cross-sectional diagrams of a solar cell module of an embodiment of the present application.

FIG. 9A illustrates a cross-sectional diagram of another solar cell module embodiment of the application. A solar cell module 100 comprises an electromagnetic wave gathering device 60 and at least one energy transfer device 70. The electromagnetic wave gathering device 60 can be any one of the electromagnetic wave gathering devices described above, the pillared electromagnetic wave gathering device as shown in FIGS. 1-6, or can be the flat-plate electromagnetic wave gathering device as shown in FIGS. 7A-8B. The following embodiments are provided to describe the pillared electromagnetic wave gathering device as examples, but the embodiment is intended to illustrate and not to limit the invention.

In the embodiment, the electromagnetic wave gathering device 60 comprises a pillared electromagnetic waveguide body 62 and a reflective structure 64. The pillared electromagnetic waveguide body 62 comprises a first side surface 622 and a second side surface 624 opposite to the first side surface 622. An energy transfer device 70 is positioned near the second side surface 624, and a reflective layer 67 is positioned on the first side surface 622.

A first reflective layer 642 of the bicone reflective unit 640 of the reflective structure 64 reflects and concentrates the light towards a second side surface 624 to increase the intensity of the light entering the energy transfer device 70, and the optical energy utilization is also raised. Besides, the electromagnetic wave gathering device 60 can also replace the sun-tracking system of the conventional technology, so the solar cell module 100 is more convenient to use, and the application of the solar cell module 100 also expands. Otherwise, the reflective layer 67 is positioned on the first side surface 622 for reflecting the light incident on the first side surface 622 towards the second side surface 624. Thus, the intensity of the light entering the energy transfer device 70 and the optical energy utilization of the solar cell module 100 both are raised.

Figure 9B:
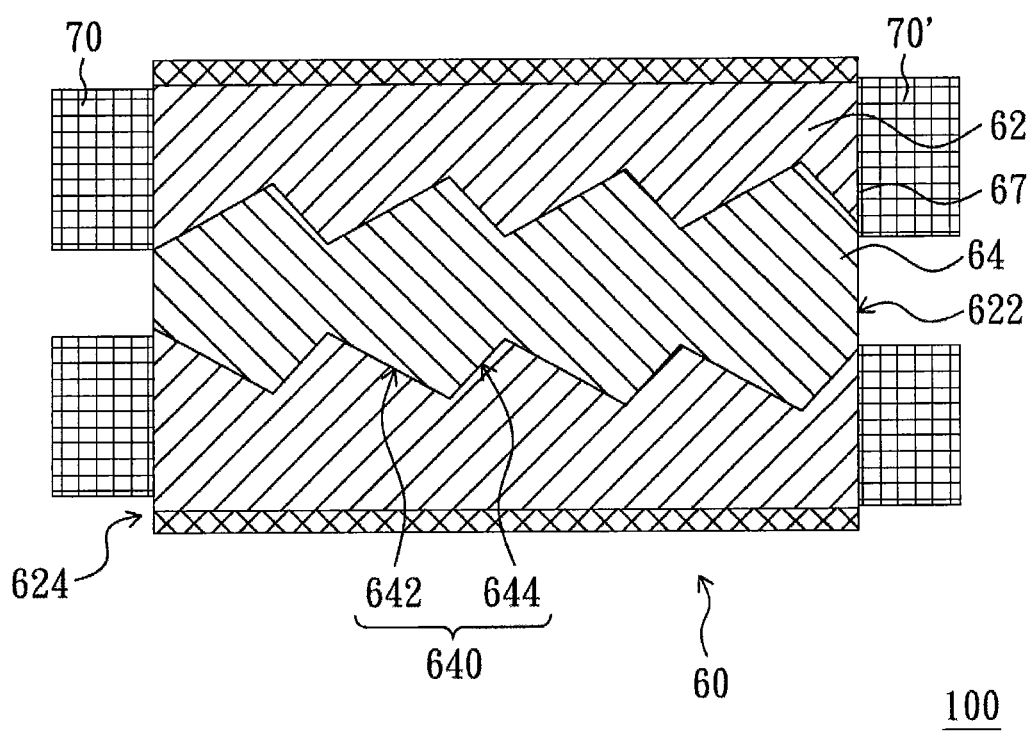

FIG. 9B illustrates a cross-sectional diagram of another solar cell module embodiment of the application. The energy transfer device 70 can be positioned on the second side surface 624 as shown in FIG. 9A, and another energy transfer device 70' can be positioned on the first side surface 622 as shown in FIG. 9B to receive the light reflected from the second reflective layer 644.

Besides, the above-described energy transfer device is the solar cell. The material of the solar cell comprises single crystal silicon, poly silicon, III-V group semiconductors, or copper indium gallium selenide.

As mentioned above, the electromagnetic wave gathering device and the solar cell of the application comprise the pillared electromagnetic waveguide body and the reflective structure. Therefore, the light from different directions progresses into the pillared electromagnetic waveguide body vertically without the aid of the sun-tracking system, and the convenient use of the electromagnetic wave gathering device and the solar cell is raised. With the cooperation of the pillared electromagnetic waveguide body, the reflective structure reflects the light towards the predetermined direction and condenses the light easily. Without the influence of the focus and the focal length, the reflective structure helps to reduce the volume of electromagnetic wave gathering device.

It will be apparent to those having ordinary skill in the art that various modifications and variations can be made to the devices in accordance with the present application without departing from the scope or spirit of the application. In view of the foregoing, it is intended that the present application covers modifications and variations of this application provided they fall within the scope of the following claims and their equivalents.

What is claimed is:

1. An electromagnetic wave gathering device comprising:
a pillared electromagnetic waveguide body extended along a longitudinal direction; and
a plurality of orbicular or partial bicone reflective units encircled by the pillared electromagnetic waveguide body connected to each other continuously and extended along the longitudinal direction;
a first reflective layer formed on the bicone reflective units, wherein the cross-sectional shape of the pillared electromagnetic waveguide body and the cross-sectional shape of the bicone reflective unit are both circles.

2. The electromagnetic wave gathering device of claim 1 comprising an anti-reflective layer positioned on the surface of the pillared electromagnetic waveguide body.

3. The electromagnetic wave gathering device of claim 2, wherein the refractivity near the bicone reflective unit is larger than the refractivity near the anti-reflective layer, or the refractivity of the electromagnetic waveguide body increases along the direction from the anti-reflective layer to the bicone reflective unit gradually or stepwise.

4. The electromagnetic wave gathering device of claim 1, further comprising a second reflective layer formed on the bicone reflective unit, and the first reflective layer is connected to the second reflective layer adjacently, separately, or seamlessly.

5. The electromagnetic wave gathering device of claim 4, wherein the abutment of the first reflective layer and the second reflective layer comprises an angle or an arc shape, and/or the first reflective layer and the second reflective layer comprise an inclined surface or an arc surface.

6. The electromagnetic wave gathering device of claim 1, wherein the bicone reflective unit is a hollow structure.

7. The electromagnetic wave gathering device comprising:
a flat-plate electromagnetic waveguide body extended along a longitudinal direction, comprising a first surface and a second surface;
a plurality of reflective units positioned on the second surface connected to each other continuously and along the longitudinal direction, wherein the reflective unit comprises a first inclined surface and a second inclined surface, and the abutment of the first inclined surface and the second inclined surface comprises an arc shape from a first cross-sectional view; and
a first reflective layer formed on the first inclined surface, wherein the first reflective layer is parallel to one of the first surface and the second surface from a second cross-sectional view perpendicular to the first cross-sectional view.

8. The electromagnetic wave gathering device of claim 7 further comprising a second reflective layer positioned on the second inclined surface.

9. The electromagnetic wave gathering device of claim 7 further comprising an anti-reflective layer positioned on the first surface.

10. The electromagnetic wave gathering device of claim 7, wherein the refractivity near the first surface of the electromagnetic waveguide body is smaller than the refractivity near the second surface of the electromagnetic waveguide body, or the refractivity of the electromagnetic waveguide body increases along the direction from the first surface to the second surface gradually or stepwise.

11. The electromagnetic wave gathering device of claim 7, wherein the first surface and the second surface comprises a flat or arc.

12. The electromagnetic wave gathering device of claim 4, wherein an area of the first reflective layer is larger than an area of the second reflective layer.

13. The electromagnetic wave gathering device of claim 1, wherein the pillared electromagnetic waveguide body has a first side surface, a second side surface opposite to the first side surface, and a light-receiving surface connected to the first side surface and the second side surface.

14. The electromagnetic wave gathering device of claim 13, wherein the light-receiving surface is parallel with the longitudinal direction.

15. The electromagnetic wave gathering device of claim 13, further comprising an energy transfer device positioned on the first side surface.

16. The electromagnetic wave gathering device of claim 15, further comprising a reflective layer formed on the second side surface.

17. The electromagnetic wave gathering device of claim 1, wherein the material of the first reflective layer comprises metal.

18. The electromagnetic wave gathering device of claim 1, wherein the material of the first reflective layer comprises a distributed bragg reflector.

19. The electromagnetic wave gathering device of claim 15, wherein the energy transfer device comprises solar cell.

* * * * *